United States Patent [19]
Noguchi

[11] Patent Number: 4,810,911
[45] Date of Patent: Mar. 7, 1989

[54] FET SWITCH CIRCUIT HAVING SMALL INSERTION LOSS AND EXHIBITING STABLE OPERATION

[76] Inventor: Tsutomu Noguchi, c/o NEC Corporation, 33-1, Shiba 5-chome, Minato-ku, Tokyo, Japan

[21] Appl. No.: 120,604

[22] Filed: Nov. 16, 1987

[30] Foreign Application Priority Data

Nov. 14, 1986 [JP] Japan ................. 61-271163

[51] Int. Cl.$^4$ ............... H03K 17/687; H03K 17/56; H03K 5/153
[52] U.S. Cl. ........................... 307/571; 307/575; 307/584; 307/241; 307/243; 307/244; 307/362; 307/364
[58] Field of Search ............... 307/511, 573, 574, 575, 307/577, 583, 584, 241, 242, 362, 364, 355

[56] References Cited

U.S. PATENT DOCUMENTS

| | | | |
|---|---|---|---|
| 3,280,386 | 10/1986 | Philips | 307/242 |
| 3,360,788 | 12/1967 | Casale et al. | 307/242 |
| 3,393,382 | 7/1968 | Myers | 307/242 |
| 4,204,131 | 5/1980 | Dozier | 307/241 |
| 4,719,374 | 1/1988 | Bialo | 307/342 |

OTHER PUBLICATIONS

Y. Tajima, W. Titus, R. Mozzi, A. Morris, "Broadband GaAs FET 2×1 Switches", GaAs Symposium Technical Digest, Oct. 23-25, 1984, pp. 81-84.

*Primary Examiner*—Stanley D. Miller
*Assistant Examiner*—Trong Quang Phan

[57] ABSTRACT

Disclosed is a switch circuit comprising one common input/output terminal, two switching input/output terminals, series field effect transistors respectively inserted between the common input/output terminal and the two switching input/output terminals, shunt field effect transistors respectively inserted between the two switching input/output terminals and the ground, and resistors respectively inserted between the ground and the common input/output terminal and between the ground and the two switching input/output terminals, the resistors having the resistance values smaller than that of the shunt field effect transistors at OFF state.

10 Claims, 2 Drawing Sheets

PHASE SHIFT CIRCUIT

FET SWITCH CIRCUIT HAVING SMALL INSERTION LOSS AND EXHIBITING STABLE OPERATION

BACKGROUND OF THE INVENTION

1. Field of the Invention

The present invention relates to a switch circuit using field effect transistors (FETs) as switching devices, and more particularly to a switch circuit in which an electrical path is switched over between two paths by use of FETs.

2. Description of the Related Art

A single-pole double-throw (SPDT) switch having one input terminal and two output terminals has been used widely as a switch operating in a microwave band and in a millimeter-wave band. The SPDT switch is used, for example, for selectively connecting a radar antenna to a transmitter or a receiver.

In the SPDT switch a depletion-type metal-semiconductor field-effect transistor (MESFET) using compound semiconductor such as GaAs is inserted between the input terminal and each of the two output terminals, as shown in FIGS. 3 and 5 of an article "Broadband GaAs FET 2×1 Switches" by Y. Tajima et al., IEEE GaAs Symposium Digest, pp. 81-84, 1984. The depletion-type MESFET takes the "ON" state to show a low resistance when its gate electrode is at 0 volt and takes the "OFF" state to show a high resistance when its gate electrode is biased at a voltage below a threshold value.

The present inventor has newly found such a disadvantage of the SPDT switch when it is fabricated on a GaAs substrate that a difference in potentials appears between the input terminal and one of the output terminals on the side of the ON-state FET and causes an increase in the ON-resistance of that FET to increase the insertion loss between the input and output terminals and generate imbalance of insertion losses between the output terminals.

SUMMARY OF THE INVENTION

It is, therefore, an object of the present invention to provide a switch circuit which has a small insertion loss and does not generate imbalance of insertion losses between its output terminals.

The switch circuit in accordance with the present invention comprises a common terminal to be used as either input or output terminal, first and second switching terminals to be used as either output or input terminals, a reference terminal held at a reference voltage, a first field effect transistor inserted in series between the common terminal and the first switching terminal, a second field effect transistor inserted in series between the common terminal and the second switching terminal, a third field effect transistor connected between the first switching terminal and the reference terminal, a fourth field effect transistor connected between the second switching terminal and the reference terminal, a first resistor connected between the reference terminal and the common terminal, a second resistor connected between the reference terminal and the first switching terminal, and a third resistor connected between the reference terminal and the second switching terminal. The first to third resistors should have resistance values smaller than the resistance values of the third and fourth field effect transistors at the OFF state and sufficiently larger than a load resistance.

Since the resistors having the above-mentioned resistance values are inserted between the reference terminal and the input/output terminals, the potential at each of the input/output terminals becomes equal to that of the reference terminal so that no potential difference appears between the input/output terminals. Consequently, the "ON" resistance of the first or second field effect transistor inserted in series between the common and the switching terminal is kept small without being varied, and the insertion loss between the common and the switching terminal becomes small.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
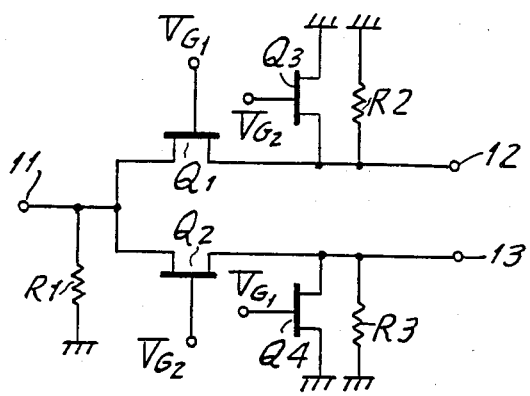
FIG. 1 is a circuit diagram showing a switch circuit in accordance with a first embodiment of the present invention.

Referring to FIG. 1, a SPDT type switch circuit in accordance with the first embodiment of the present invention comprises one input (or output) terminal 11, two output (or input) terminals 12 and 13, a pair of MESFETs $Q_1$ and $Q_2$ inserted in series between the input terminal 11 and output terminals 12 and 13, a pair of MESFETs $Q_3$ and $Q_4$ respectively inserted between the output terminals 12 and 13 and the ground, a resistor $R_1$ connected between the input terminal 11 and the ground, and a pair of resistors $R_2$ and $R_3$ respectively connected between the output terminals 12 and 13 and the ground. When the gate voltage $V_{G1}$ of the MESFET $Q_1$ and the MESFET $Q_4$ is set at zero volt while the gate voltage $V_{G2}$ of the other MESFETs $Q_2$ and $Q_3$ is set at a negative voltage below the threshold voltage $V_T$, the MESFETs $Q_1$ and $Q_4$ turn on to show a low resistance value while the MESFETs $Q_2$ and $Q_3$ turn off to show a high resistance value so that the circuit portion between the input terminal 11 and the output terminal 12 becomes conductive (ON) while the circuit portion between the other output terminal 13 and the input terminal 11 is cut off (OFF). ON-OFF switching of the two circuit portions can be made by changing the gate voltage $V_{G1}$ of the FETs $Q_1$ and $Q_4$ to the negative voltage lower than the threshold and the gate voltage $V_{G2}$ to the zero volt.

Figure 2:
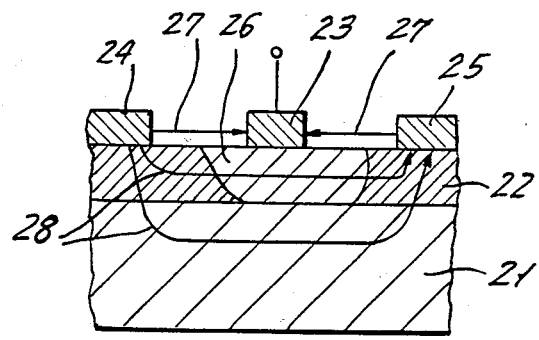
FIG. 2 is a sectional view of MESFET used for the switch shown in FIG. 1.

Each of the MESFETs employed has a structure, as shown in FIG. 2, which includes a gate electrode 23 forming a Schottky contact with an active GaAs layer 22 on a semi-inculating GaAs substrate 21, and a source electrode 24 and a drain electrode 25 ohmically contacting with the active GaAs layer 22. When the gate electrode 23 is based at a voltage lower than the threshold voltage, the depletion region 26 reaches the semi-insulating substrate 21 to bring the FET into the "OFF" state. Due to instability of surface state, a leakage current 27 flows through the surface of the active layer 22 between the gate 23 and the source 24 and between the gate 23 and the drain 25. The leakage current 28 also flows between the source 24 and the drain 25 through the depletion layer 26 and the semi-insulating GaAs substrate 21. Thus, the MESFET under the "OFF" state has a leakage current flowing to some extent between the source and the drain.

Assuming that the resistors $R_1$, $R_2$ and $R_3$ do not exist in the circuit shown in FIG. 1 and that FETs $Q_1$ and $Q_4$ are ON and FETs $Q_2$ and $Q_3$ are OFF, the output terminal 13 is kept at the zero potential because of the ON-resistance of $Q_4$ as low as about 10 ohms, but a small leakage current flows from the ground through the FET $Q_4$ in the "ON" state and a path between source and drain of the FET $Q_2$ in the "OFF" state. Since the FET $Q_2$ itself is under the high resistance state, a potential difference of more than 1V is generated between source and drain of the FET $Q_2$ and a negative potential corresponding to this potential difference appears at the input terminal 11. Similarly, a negative potential is generated at the output terminal 12 by the FET $Q_3$. The potential difference at these terminals 12 and 11 may become more than 0.5V, depending on the resistance values of the FETs $Q_2$ and $Q_3$ at the "OFF" state, the variance of the leakage current of these FETs and the resistance value of the FET $Q_4$ at the "ON" state. When such a potential difference exists between the input terminal 11 and the output terminal 12, the ON-resistance of the FET $Q_1$ increases and the insertion loss between the input and output terminals increases, as well.

Figure 3:
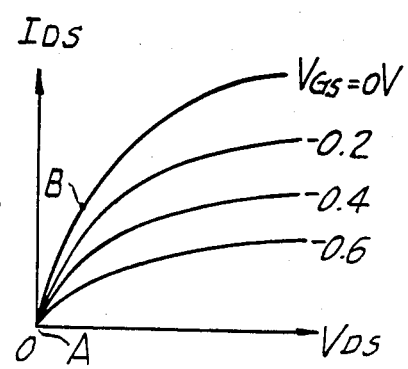
FIG. 3 is a diagram showing the D.C. characteristics of MESFET used for the switch shown in FIG. 1.

FIG. 3 shows a D.C. characteristic of MESFET for explaining the above phenomenon. The source-drain voltage $V_{DS}$ of the MESFET $Q_1$ (the voltage between the input terminal 11 and the output terminal 12) is plotted on the abscissa while its drain-source current ($I_{DS}$) is plotted on the ordinate using the gate-source voltage $V_{GS}$ as a parameter. The ON-resistance of FET $Q_1$ is equal to the inverse number of the inclination of the tangent of these curves and has the greatest inclination (the smallest resistance) when the voltage $V_{DS}$ is zero volt. This ideal operation point is shown by a point A. When the potential difference exists between the input and output terminals, the operation point moves upward to a point B and the ON-resistance increased up to, for example, 16 ohms and the insertion loss gets deteriorated by 0.2 dB, for example. Since the resistance values of the MESFETs $Q_1$ to $Q_4$ at the "ON" and "OFF" states and the degree of leakage currents therein differ from FET to FET, an imbalance of about 0.2 dB occurs in the insertion loss between the output terminals.

The resistance value of the MESFET at the "OFF" state is generally more than 100 kiloohms. The loads which are to be connected to the input terminal 11 or the output terminals 12 and 13 generally have a characteristic impedance of 50 ohms in order to prevent the increase in the insertion loss in the microwave band and the millimeter-wave band.

In accordance with the present invention, the resistors $R_1$, $R_2$ and $R_3$ connected to the input and output terminals 11, 12 and 13, respectively, have resistance values smaller than the resistance value of MESFET at the "OFF" state, favorably of 10 kiloohms or less and more favorably 5 kiloohms. According to the presence of these resistors, the potential difference between the source and drain of the MESFET can be reduced to a value less than one tenth of that in the switch using no such resistor and the ON-resistance of the MESFET can be made extremely small. Furthermore, the increase in the insertion loss can be suppressed by setting the resistance values to be greater than the load resistance (50 ohm) by at least 20 times (i.e., 1 kiloohm) and favorably by 100 times (i.e., 5 kiloohms). It is relatively easy to manufacture a resistor having a resistance of 10 kiloohms or less on the GaAs substrate, since its length become not too large or control of the impurity density is not difficult.

When the resistors $R_1$, $R_2$ and $R_3$ do not exist, the insertion loss is 0.6 dB. When the resistors $R_1$, $R_2$ and $R_3$ having a resistance of 1 kiloohm are used, the insertion loss becomes 0.55 dB and when the resistance of these resistors $R_1$, $R_2$ and $R_3$ is 5 kiloohms, the insertion loss can be improved to 0.5 dB.

When the resistors $R_1$, $R_2$ and $R_3$ having the resistance of 1 to 10 kiloohms are employed, the imbalance of insertion loss between the output terminals becomes 0.05 dB which is far smaller than 0.2 dB in the switch without these resistors. Moreover, the isolation remains unaltered at 18 dB even when these resistors $R_1$, $R_2$ and $R_3$ are employed. The resistors $R_2$ and $R_3$ connected to the output terminals 12 and 13 should have the equal resistance value to maintain the symmetry of the two terminals 12 and 13, and the resistance of the resistor $R_1$ at the input terminal 11 may have a different value from the resistor $R_2$ or $R_3$.

Figure 4:
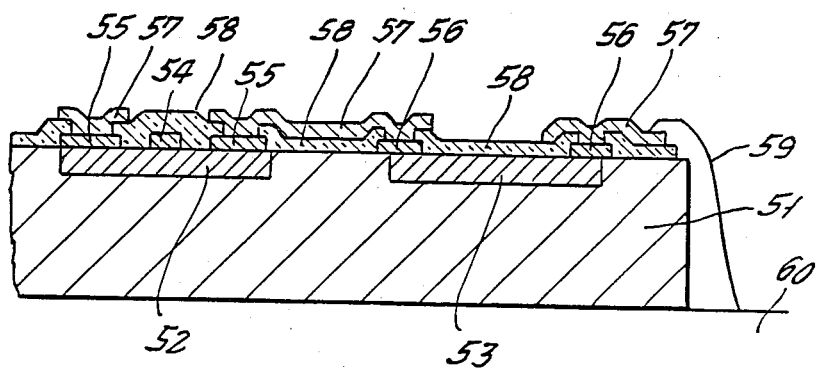
FIG. 4 is a sectional view showing a part of the switch used in the first embodiment of the present invention shown in FIG. 1.

FIG. 4 is a sectional view showing part of the switch of the embodiment which is integrated on the GaAs substrate. An n-type active layer 52 having an impurity concentration of about $2 \times 10^{17}/cm^3$ and a resistor layer 53 having an impurity concentration of about $5 \times 10^{17}/cm^3$ are formed on a semi-insulating GaAs substrate 51 by selectively implanting Si ions. Each MESFET is formed on each active layer 52 by forming an Al gate electrode 54 and Ge-Ni source and drain electrode 55 on the active layer 52, and an ohmic electrode 56 using Ge-Ni is formed at both ends of the resistor layer 53. A passivation film 58 of $SiO_2$ is deposited onto the surface. A predetermined number of FETs and resistors having the structure described above are formed on the substrate 51 and are connected to each other by Al wirings 57, thereby completing the switch circuit of the first embodiment of the present invention on the GaAs substrate 51. The GaAs substrate 51 on which the switch circuit is thus formed as an integrated circuit is attached to an element-bonding area 60 of a container or a circuit board which is kept at a fixed potential, and the element-bonding area 60 and the predetermined portions of the wirings 57 are connected by a gold wiring 59.

Figure 5:
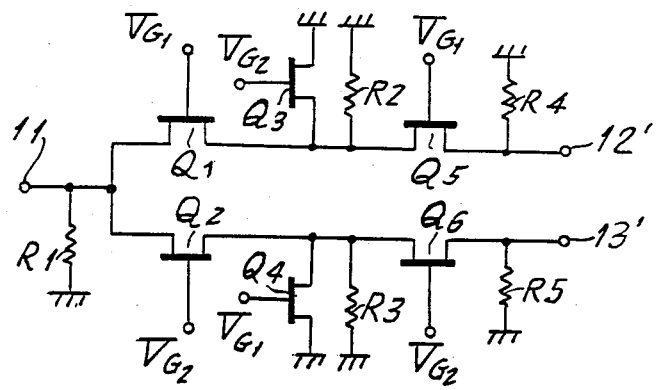
FIG. 5 is a circuit diagram of the switch in accordance with the second embodiment of the present invention.

FIG. 5 is a circuit diagram showing the second embodiment of the present invention. This circuit is formed by adding a pair of series FETs $Q_5$, $Q_6$ and a pair of resistors $R_4$, $R_5$ to the output terminals 12 and 13 of the circuit shown in FIG. 1 of the first embodiment. The resistors $R_4$ and $R_5$ are connected between output terminals 12', 13' and the ground. Whereas the isolation of the switch of the first embodiment is 18 dB, the switch of the second embodiment can be greatly increased to 40 dB.

In this embodiment, the drain and source potentials of series FETs $Q_1$, $Q_2$ and $Q_5$, $Q_6$ can also be kept at substantially zero volt due to the resistors $R_1$ to $R_5$. When resistors $R_1$ to $R_5$ have a resistance value of 5 kiloohms, the insertion loss of switch is 0.9 dB. On the other hand, when these resistors $R_1$ to $R_5$ are not used, the insertion loss becomes as great as 1.2 dB.

Figure 6:
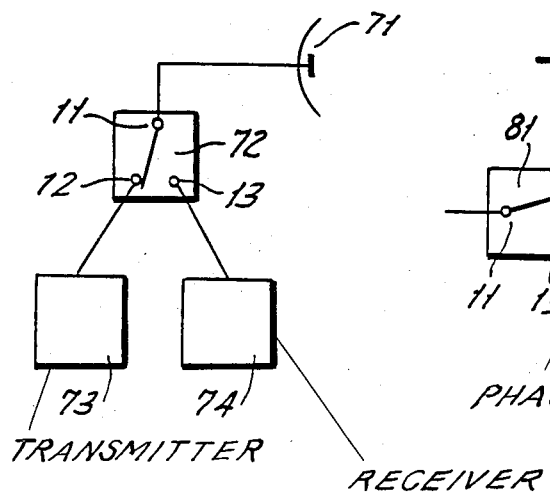
FIG. 6 is a block diagram showing a radar system as a first example of applications of the switch according to the present invention.

FIG. 6 shows an example of the radar system utilizing the switch circuit 72 of the present invention. The terminals 11, 12 and 13 are connected respectively to a radar antenna 71, a transmitter 73 and a receiver 74, and the transmitter 73 and the receiver 74 are switched over by the switch circuit 72 of the present invention.

Figure 7:
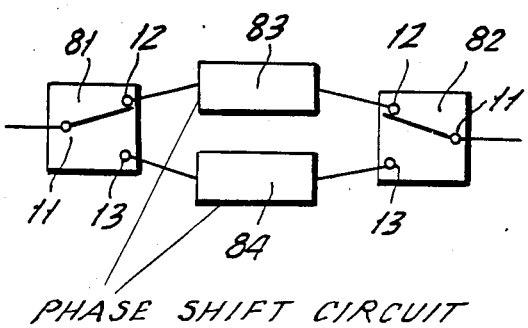
FIG. 7 is a block diagram showing a phase shifter as a second example of applications of the switch according to the present invention.

FIG. 7 shows another example of the application of the switch circuit, in which a phase shifter is constituted by use of two switch circuits 81 and 82 of the present invention. Two phase shift circuits 83 and 84 each for shifting a signal phase are disposed between the terminals 12 and 13 of the switch circuits 81 and 82 and signals having different phases can be obtained by changing over the switch circuits 81 and 82. In addition to requirement for the small insertion loss of the switch circuit, no difference of insertion losses between the terminals 12 and 13 is also required for the phase shifter. The switch circuits of the present invention provide an excellent effect when applied to the phase shifter.

Although some preferred embodiments of the present invention are explained with reference to drawings, various modifications can be applicable to the invention. For example, FET's used in the embodiments may be any type of junction gate field effect transistors such as PN-junction FETs. Furthermore, FETs may be formed with Si or other III–V compound semiconductors, not limited to GaAs.

I claim:

1. A switch circuit comprising:
    a first input/output terminal;
    a second input/output terminal;
    a third input/output terminal;
    a fixed potential terminal;
    a first field effect transistor inserted in series between said first input/output terminal and said second input/output terminal;
    a second field effect transistor inserted in series between said first input/output terminal and said third input/output terminal;
    a third field effect transistor connected between said second input/output terminal and said fixed potential terminal;
    a fourth field effect transistor connected between said third input/output terminal and said fixed potential terminal;
    a first resistor connected between said fixed potential terminal and said first input/output terminal;
    a second resistor connected between said fixed potential terminal and said second input/output terminal; and
    a third resistor connected between said fixed potential terminal and said third input/output terminal, wherein said first, second and third resistors have resistance values smaller than the resistance values of said third and fourth field effect transistors at OFF state.

2. The switch circuit as claimed in claim 1, wherein said first to fourth field effect transistors are metal semiconductor field effect transistors using compound semiconductor.

3. The switch circuit as claimed in claim 2, wherein said first to fourth field effect transistors are GaAs metal semiconductor field effect transistors.

4. The switch circuit as claimed in claim 1, wherein said first to third resistors have impedance values larger than that of loads to be connected to said second input/output terminal and said third input/output terminal.

5. The switch circuit as claimed in claim 1, wherein said first to third resistors have a resistance value of 1 to 10 kiloohms.

6. A transistor switch comprising:
    a first input/output terminal;
    a second input/output terminal;
    a reference terminal held at a fixed potential;
    a first field effect transistor inserted in series between said first input/output terminal and said second input/output terminal;
    a second field effect transistor inserted between said second input/output terminal and said reference terminal; and
    first and second resistors respectively connected between said reference terminal and said first input/output terminal and between said reference terminal and said second input/output terminal and having resistance values smaller than that of said second field effect transistor at OFF state.

7. The transistor switch as claimed in claim 6, wherein said first and second field effect transistors are metal semiconductor field effect transistors using compound semiconductor.

8. The transistor switch as claimed in claim 7, wherein said first and second field effect transistors are GaAs metal semiconductor field effect transistors.

9. The transistor switch as claimed in claim 6, wherein said first and second resistors have an impedance greater than that of a load to be connected to said second input/output terminal.

10. The transistor switch as claimed in claim 6, wherein said first and second resistors have a resistance of 1 to 10 kiloohms.

* * * * *

UNITED STATES PATENT AND TRADEMARK OFFICE
CERTIFICATE OF CORRECTION

PATENT NO. : 4,810,911

DATED : March 7, 1989

INVENTOR(S) : Tsutomu Noguchi

It is certified that error appears in the above-identified patent and that said Letters Patent is hereby corrected as shown below:

Title page:

The patent should include the assignee data,

--Assignee: NEC Corporation, Japan--.

Signed and Sealed this

Second Day of April, 1991

Attest:

HARRY F. MANBECK, JR.

Attesting Officer

Commissioner of Patents and Trademarks